United States Patent Office 3,740,376

Patented June 19, 1973

3,740,376

PHOTOSENSITIVE POLYMER LAYERS OF VINYL ALCOHOL POLYMERS

Erich Wolff, Leichlingen, Wolfgang Lassig, Cologne, Eckart Seelig, Leverkusen, and Günther Kolf, Bergisch Gladbach, Germany, assignors to Agfa-Gevaert Aktiengesellschaft, Leverkusen, Germany No Drawing. Filed Oct. 27, 1970, Ser. No. 84,543

Int. Cl. C08f *27/00, 27/10, 27/20*

U.S. Cl. 260—73 R 3 Claims

ABSTRACT OF THE DISCLOSURE

The light sensitivity of certain photocrosslinkable polymer layers which in the presence of organic azide compounds as crosslinking agents yield upon exposure to actinic light crosslinked unsoluble products is substantially increased if photocrosslinkable polymers are used which contain as side chain a benzene ring which is on the nucleus methyl or methylene substituted.

This invention relates to a photosensitive layer with a polymer containing groups which react upon exposure to actinic light with azide groups to yield unsoluble crosslinked products.

It is known that various polymers are light-sensitive. In the form of thin layers on a suitable support those polymers are crosslinked, i.e. hardened image-wise, on exposure to light so that the uncrosslinked portions of the layer can be dissolved out by subsequent development with a suitable solvent, whilst the exposed crosslinked image portions of the layer are insoluble. Thus the exposed portions form a relief image on the support.

Layers of this kind usually contain photocrosslinking agents such as bichromates, azides or cinnamic acid esters. These crosslinking groups can either be attached to the polymer itself or alternatively can be added to the layer in the form of a low molecular weight crosslinking agent.

U.S. Pat. No. 2,940,853 relates to photocrosslinkable layers containing so-called cyclorubber or condensation products of epichlorhydrin and 2,2-bis-(4-hydroxyphenyl)-propane as the polymer and a diaryl azide as the crosslinking agent.

It is also known that aromatic carbonyl azide or sulfonyl azide compounds can be used for the same purpose. Sulfonyl azide compounds are described in U.S. Pat. No. 3,467,518.

Unfortunately, the aforementioned light-sensitive polymer layers have certain disadvantages. For example, their sensitivity to light is generally inadequate so that relatively long exposure times are required in order to obtain sufficiently sharp relief images. Other polymers, for example those crosslinked with cinnamic acid derivatives, do not show sufficient resistance to strong acids. Although various polymers show a sufficiently high resistance to acids, they are not sufficiently stable to the effect of heat so that they are unsuitable for use after storage because gradual heat-induced crosslinking occurs even in the absence of light.

Although other polymers are resistant to acids and are sufficiently heat-stable, the unexposed portions of the layer have to be dissolved out with solvents in which the crosslinked portions are also swollen to a considerable extent so that poorly defined relief images are obtained.

It is among the objects of the invention to provide a photocrosslinkable layer which shows improved light-sensitivity and chemical resistance, especially to acids.

We now have found a light-sensitive polymer containing a polymer which becomes insoluble on exposure to light and an organic azide compound as the crosslinking agent, the following polymers being present as the photocrosslinkable polymers.

(1) Homopolymers or copolymers of olefinically unsaturated monomers containing as side chain benzene rings which are methyl- or methylene-substituted at the benzene nucleus and which are attached to the polymer chain either directly or through an ester-, acetal-, urethane-, carbamoyl-, sulfonamide- or sulfonyl-urethane bridge.

(2) Polyesters or polyethers with hydroxyl groups the hydrogen atoms of which are either completely or partly substituted through an ester-, acetal- or urethane bridge with a nucleus of a benzene ring containing a methyl or methylene group, or (3) Polyamides whose amide groups are substituted either wholly or in part by benzoyl groups containing methyl or methylene groups at the nucleus.

Conventional organic azide compounds, especially aromatic compounds containing azide, carbonyl azide, sulfonyl azide or azidoformate groups, are suitable for use as the crosslinking agents. Compounds of this kind are described for example in U.S. Pats. Nos. 2,852,379; 2,940,853 or 3,467,518 or in British Pat. No. 790,131.

Optimum combinations of crosslinking agents and crosslinkable polymers can be obtained by a few simple routine tests customarily employed in the art.

The polymers used in accordance with the invention can either be prepared from monomers in which the methylene- or methyl-substituted benzene ring is already present, or by introducing benzene radicals containing methyl or a methylene group at the nucleus into a given polymer by reaction with suitable components.

Examples of the first type include homopolymers and copolymers of nuclear-alkylated styrenes. Examples of suitable copolymer components include butadiene or methacrylic acid or acrylic acid or derivatives thereof, for example methacrylonitrile or acrylonitrile, as well as esters or amides of these polymerisable acids.

Reference is also made to polyesters whose acid or alcohol component are wholly or in part substituted with groups of the benzene series to the nucleus of which are attached methyl or methylene groups. Polycarbonates whose phenolic components contain methyl or a methylene group on the benzene ring have also proved to be suitable.

Particularly advantageous is the second of the two methods referred to above for obtaining the polymeric compounds.

Especially suitable starting products include polymeric compounds of the kind which contain groups with active hydrogen (Zerewitinoff hydrogen), for example those containing hydroxyl, carboxyl, mercapto, primary or secondary amino, carbamoyl, carboxylic acid imide, sulfonamide or acid methylene groups.

Suitable reaction components for these polymers include compounds containing a benzene ring with a methyl or methylene group directly attached to the nucleus, and a group which is able to react with the active hydrogen of the polymer. Reactions of this kind are well known in principle. We refer in this connection to U.S. Pats. Nos. 2,940,853 and 3,449,294. Examples of reactive components include acid chlorides, either inorganic or organic in nature, for example carboxylic acid chlorides, phosphoric acid chlorides or sulfonyl chlorides, also isocyanates, aldehydes etc.

Suitable reaction components are set out in the following table:

(1)
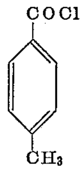

(2)
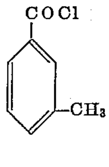

(3)
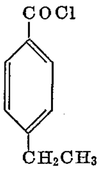

(4)
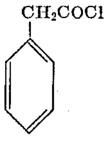

(5)
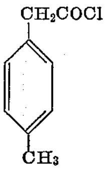

(6)
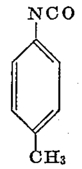

(7)
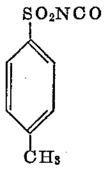

(8)
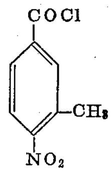

(9)
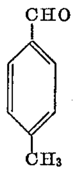

(10)
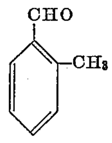

(11)
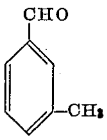

(12)
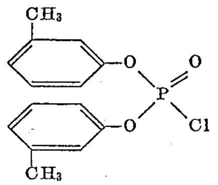

The preparation of a few polymeric reaction products of this kind is described in detail in the following, others being similarly prepared.

Polyvinyl alcohols or copolymers containing vinyl alcohol units in polymerised form, represent suitable polymers. Any other units of polymerisable monomers, especially vinyl monomers, may be present as the non-reactive polymer components, examples being ethylene, propylene, butylene, butadiene, isoprene, vinyl chloride, vinylidene chloride, vinyl esters, especially vinyl acetate or vinyl propionate, vinyl ethers, for example vinyl propyl ether, vinyl isobutyl ether, acrylic acid or methacrylic acid or their derivatives such as their esters, especially with aliphatic alcohols containing up to 5 carbon atoms, nitriles, maleic acid anhydride, styrene etc. Partially hydrolysed copolymers of ethylene and vinyl acetate are particularly suitable.

Polycondensates containing active hydrogen atoms, especially alcoholic hydroxyl groups, are also suitable, for example polyesters of polyvalent aliphatic or aromatic carboxylic acids with polyhydric alcohols, hydroxyl-group-containing polyurethanes or polyethers or hydroxyl-group-containing epoxide resins of the kind obtained, for example, by reacting polyvalent carboxylic acids, alcohols or amines with epihalogen hydrins, especially epichlorhydrin, also polyamides, for example reaction products of polyvalent carboxylic acids with polyvalent amines.

The polymeric reaction components should with advantage have an average molecular weight in excess of 1000. The average molecular weight best suited to the particular application intended can readily be determined by carrying out the usual tests. The optimum molecular weight range is of course also governed by the type of polymer. Particular utility is exhibited by polymers having an average molecular weight of between 1000 and 100,000.

Reaction product of polyvinyl alcohol (average molecular weight around 40,000) with compound 12

10 g. of a partially hydrolysed polyvinyl acetate (degree of hydrolysis 88 mol percent) were swollen overnight at 100° C. in 100 ml. of pyridine. Another 150 ml. of pyridine were then added, and ⅕ of the solvent distilled off in vacuo. The mixture was then cooled to 50° C., followed by the dropwise addition over a period of 30 minutes of a solution of 55 g. of phosphoric acid-di-m-cresyl ester chloride in 50 ml. of dry chlorobenzene. The reaction mixture was stirred for 2 hours in a bath at 50° C., subsequently diluted with 200 ml. of acetone and finally precipitated in 5 litres of methanol/water (1:1). The deposit was washed thoroughly with cold water and methanol and then dried.

Reaction product of a hydrolysed copolymer of ethylene and vinyl acetate (molar ratio 25:75, molecular weight approximately 50,000) with compound 2

20 g. of the above-mentioned hydrolysed copolymer containing 22.3% of free OH groups were dissolved in 250 ml. of pyridine. Approximately ⅕ of the solvent was then distilled off in vacuo, followed by the dropwise addition to the mixture over a period of 15 minutes at 50° C. of a solution of 37.7 g. of m-tolylic acid chloride in 50 ml. of chlorobenzene. Stirring was then continued for 2 hours at 50° C., after which the reaction mixture was diluted with 200 ml. of acetone and finally precipitated with 5 litres of methanol. The precipitate was washed thoroughly with water and methanol and dried at 50° C.

Reaction product of a hydrolysed copolymer of polyvinyl chloride and polyvinyl acetate (60% by weight of vinyl chloride and 40% by weight of vinyl acetate, average molecular weight around 80,000) with compound 6

200 ml. of pyridine were added to 10 g. of the above-mentioned hydrolysed copolymer (5.3% of OH groups), followed by gradual heating to 100° C. 50 ml. of the solvent were then distilled off in vacuo, followed by the dropwise addition of 4.5 g. of p-tolyl isocyanate in a little chlorobenzene. Stirring is then continued for 2 hours at 60° C., after which the reaction is stopped with 10 ml. of methanol and the reaction product precipitated in 3 litres of methanol. The precipitate was washed thoroughly with water and alcohol and dried at 50° C.

Reaction products of an epoxide resin of 2,2-bis(4-hydroxyphenyl)-propane with epichlorohydrin (average molecular weight approximately 2000) with compound 2

20 g. of a polyhydroxy ether of the aforementioned type (for example phenoxy resin PKHH, a product of Union Carbide) were dissolved in 200 ml. of pyridine. The mixture is then heated to 50° C., some of the solvent distilled off in vacuo and 15 g. of m-tolylic acid chloride added dropwise.

Stirring is then continued for 2 hours at 60° C., after which the reaction product is precipitated in 5 litres of methanol.

Low molecular weight or high molecular weight organic azides, preferably aryl azides, are suitable for use as the crosslinking agents. It is preferred to use low molecular weight benzene azido compounds containing at least 2 azido groups, such as the following for example: 4,4' - diazidostilbene, 1,4 - diazidobenzene, 4,4'-diazido benzophenone, 4,4' - diazidophenylmethane, 4,4'-diazido dibenzalacetone, 1,3 - di - (4 - azidophenyl)-2,3-propen - 1 - one, 1,2-di-(4 - azidocinnamoyloxy)-ethane, 4,4' - di - azidodibenzal cyclohexane, 2,6-di-(4'-azido-benzal) - 4 - methyl cyclohexanone, also sulfazides such as for example 1,4 - butane disulfazide, especially 1,3-benzene disulfazide and derivatives thereof such as toluene - 2,4 - disulfazide or 4-amino - 6 - chloro-m-benzene disulfazides. It is also possible to use sulfazides of the kind containing 2 phenyl groups such as in particular 4,4'-diphenyl disulfazide, 4,4' - diphenyl ether disulfazide or, preferably, methylene-bis-(4 - phenylene sulfazide), 4,4' - dichlorodiphenyl - 2,6' - disulfazide or 4,4'-dichloro-diphenyl - 3,5' - disulfazide. Naphthalene disulfazides, for example, 1,5-naphthylene disulfazide, 2,6-naphthylene disulfazide or 2,7-naphthylene disulfazide, are also particularly suitable.

Since the film-forming polymers used in accordance with the invention are preferably dissolved in organic solvents, crosslinking agents of the kind that are readily soluble in organic solvents are also particularly suitable.

The concentration in which the crosslinking agent is present in the layer of the film-forming polymers can vary within wide limits, depending upon the type of components in this system and also upon the desired result. Concentrations of from about 0.5 to 25% by weight of the azido crosslinking agent in the layer are sufficient for most purposes. The optimum concentration for each particular case can readily be determined by a few simple tests. It is primarily governed by the type and also the molecular weight of the polymer, by the chemical nature of the crosslinking agent and in particular upon the required layer thickness.

The light sensitivity of the layers of the present invention can be increased by addition of usual sensitizers. Suitable are for example Michler's ketone, dimethylamine benzaldehyde, 4-H-chinolizine-4-on, compounds of the naphthothiazoline series, cyanine, triphenylmethane dyes or the compounds described in U.S. Pats. Nos. 3,528,812 and 3,528,813 or the U.S. application Ser. No. 841,553 (Belgian Pat. No. 735,896).

Exposure of the layers prepared in accordance with the invention is carried out with the light sources commonly used in the reproduction technique, such as carbon arc lamps, xenon lamps, high pressure mercury lamps, which, in addition to visible light, also contain a proportion of ultra-violet light particularly effective for photocrosslinking.

Exposed layers are generally developed with organic solvents of suitable composition which may optionally be similar to or identical with the solvents used for the uncrosslinked polymers. It is preferred to employ such solvents as butyl acetate, cyclohexanone or benzene, xylene, glycol ethers and acetates or butanone in which the crosslinked portions of the layer undergo little or no swelling.

The molar concentration in the polymers of the benzene rings containing the methyl or methylene group can also vary within wide limits, being governed primarily by the type of polymer. In some cases, molar concentrations of as low as around 5% are sufficient to obtain the required effect. In general, concentrations of 20 mol percent of the effective group have proved to be adequate, even in the case of polymers which from the outset do not show the slightest sensitivity to light.

Tolyl groups have proved to be particularly effective, in which case the benzene ring can contain any other substituents such as alkyl or alkoxy preferably containing up to 5 carbon atoms, carboxyl, esterified carboxyl, nitro, nitrile, hydroxyl, sulfo, sulfonamide, esterified sulfone groups or carbamoyl groups. Secondary properties such as solubility etc. can optionally be affected by substituents such as these.

Light-sensitive polymers can be used in the layer either individually or in physical admixture with other polymers. Mixtures afford certain advantages in many cases because it is possible in this way to prepare mixtures with certain properties such as solubility in different solvents, improved adhesion to special layer supports etc.

Preferred mixture components include homopolymers or polymers of vinyl acetate, ethylene, derivatives of acrylic or methacrylic acid such as acrylic amide or methacrylic amide, esters of these acids, especially with short-chain aliphatic alcohols or nitriles of these acids, also butadiene, isoprene, styrene or vinyl alcohol. The following are mentioned in particular: copolymers of vinyl acetate, vinyl alcohol, ethylene and norbornadiene or cyclopentadiene, also copolymers of butadiene or isoprene with styrene and/or acrylonitrile. Mixtures with non-light-sensitive polymers have the further advantage that undesirable premature cross-linking of the photosensitive polymers during preparation of the layer can be almost completely eliminated.

To prepare the photocrosslinkable layers, the polymers are dissolved and the crosslinking agent added to the solution thus obtained. The crosslinking agent can be present either in dissolved form or in heterogeneously dispersed form. The solution is then applied in the usual way to the required layer support, and the solvent evaporated off. Providing suitable layer binders are used, it is also possible to prepare self-supporting layers without special layer supports.

Suitable layer supports include metal foils obtained from such metals as copper, aluminium, zinc, magnesium, steel and the like, also paper, glass or films obtained from polymeric products such as cellulose esters, polyvinyl acetate, polystyrene, polycarbonates, especially those based upon bis-phenylol alkanes, polyesters, especially those based on polyethylene terephthalate, polyamides such as nylon and the like. Other suitable substrates include materials of net-like structure such as metal gauzes.

The photocrosslinkable layers according to the invention can be used for the production of relief images or printing forms e.g. for offset printing, roto gravure printing or intaglio printing, letter press printing. Reference is made in particular to offset printing techniques, screen printing techniques, lithographic printing plates or any other printing techniques requiring a relief image. Especially important is application of the layers according to the invention as resist images for the production of so-called printed circuits.

The thickness of the photocrosslinkable layer can vary within wide limits. Layer thicknesses of from 0.001 to around 0.7 mm. are sufficient for the usual techniques. The layer thicknesses can even be greater for relief printing forms, amounting to between 0.25 and 1.5 mm.

EXAMPLE 1

Preparation of the polymers 10 g. batches of a partially hydrolysed polyvinyl acetate (degree of hydrolysis 88 mol percent) are swollen in 100 ml. of pyridine at 100° C. Another 100 ml. of pyridine are then added, and some of the solvent distilled off in vacuo. Varying quantities of benzoyl chloride and m-methylbenzoyl chloride are added to the individual batches in such a way that intially only half the benzoyl chloride is added dropwise, followed by the m-methylbenzoyl chloride and then by the rest of the benzoyl chloride at 50° C. Stirring is then continued for 2 hours at 50° C., after which the reaction product is diluted with 200 ml. of acetone and precipitated in 3 litres of methanol/water (1:1).

Light-sensitive material

15% solutions of the above polymers in glycol acetate monomethyl ether are prepared, followed by the addition of 2% by weight based on the dry film-forming polymer, of 4,4'-diazidodibenzal cyclohexanone as crosslinking agent.

An aluminium foil is coated with the above solution, and the layer dried in the usual way. After drying, the light-sensitive layer has a thickness of from 3 to 5μ.

Processing

The above layer is exposed for 4 minutes through a 0.15 grey step wedge. This exposure corresponds substantially to 2 minutes' exposure with a carbon arc lamp (42 volts, 30 amps) at a distance of 45 cm. The layer is then developed with the following solvent mixture: ethyl acetate/butyl acetate 1:1.

A sharp positive relief image of the step wedge is obtained, a varying number of steps being reproduced depending upon the light-sensitivity of the material.

The sensitivities of the various samples and their composition are set out in the following table:

TABLE 1

| Sample | In mol percent of— Benzoyl groups | m-Methyl benzoyl groups | Sensitivity in steps of the wedge |
|---|---|---|---|
| 1 | 0 | 88 | 9 |
| 2 | 10 | 78 | 8 |
| 3 | 20 | 68 | 8 |
| 4 | 30 | 58 | 9 |
| 5 | 40 | 48 | 8 |
| 6 | 50 | 38 | 9 |
| 7 | 60 | 28 | 8 |
| 8 | 70 | 18 | 6 |
| 9 | 80 | 8 | 2 |
| 10 | 88 | | (1) |

(1) No suitable image is obtained.

EXAMPLE 2

Preparation of the polymer 10 g. of partially hydrolysed polyvinyl acetate (degree of hydrolysis 88 mol percent) are swollen in 100 ml. of pyridine at 100° C. Following the addition of another 100 ml. of pyridine, some of the solvent is distilled off in vacuo. 30.2 g. of p-methyl phenyl acetic acid chloride in 50 ml. of chlorobenzene are then added dropwise with stirring over a period of 15 minutes at 50° C. Stirring is continued for 2 hours at 60° C., after which the reaction product is diluted with 200 ml. of acetone and precipitated in 3 litres of methanol/water (2:1).

Light-sensitive material

A 15% solution in glycol acetate monomethyl ether is prepared from the dried polymer thus obtained, followed by the addition of 2% by weight of 4,4'-diazido benzalacetone, based on the film-forming polymer.

Processing

Processing and exposure are carried out as in Example 1. Development is performed with trichlorethylene in liquor or in vapour form. Sensitivity: 8 steps of a grey step wedge with a density of 0.15.

A similarly prepared and processed layer of the unmodified hydrolysed polyvinyl acetate shows hardly any sensitivity to light.

EXAMPLE 3

Preparation of the polymer 30.2 g. of p-ethylbenzoic acid chloride are used instead of the p-methylphenyl acetic acid chloride of Example 2.

Light-sensitive material

A 15% solution in glycol acetate monoethyl ether is prepared from the dry polymer thus obtained, followed by the addition of 2% by weight of 1,3-di-(4-azidophenyl)-2,3-propen-1-one, based on the film-forming polymer.

Processing

Processing and exposure are carried out as in Example 1. Ethyl acetate/butyl acetate (1:1) is used as the developer. Sensitivity: 7 steps of a grey step wedge with a density of 0.15.

A similarly prepared and processed layer of the unmodified hydrolysed polyvinyl acetate shows hardly any sensitivity to light.

EXAMPLE 4

Preparation of the polymer 37 g. of 4-nitro-3-methylbenzoic acid chloride are used instead of the p-methylphenyl acetic acid chloride used in Example 2.

Light-sensitive material

An 18% solution in cyclohexanone is prepared from the polymer thus obtained, followed by the addition of 2% by weight, based on the film-forming polymer, of 4,4'-diazido dibenzalcyclohexanone.

Processing

Processing and exposure are carried out as in Example 1. Cyclohexanone is used as the developer. Sensitivity: 7 steps of a grey step wedge with a density of 0.15.

A similarly prepared and processed layer of the unmodified hydrolysed polyvinyl acetate shows hardly any sensitivity to light.

EXAMPLE 5

Light-sensitive material

Polyvinyl toluene having an average molecular weight of 50,000–80,000 is dissolved in xylene to form a solution containing 17.5 g. of poyvinyl toluene per 100 ml. This solution is then sensitized with 2% by weight of 4,4'-diazidodibenzal-cyclohexanone, based on the film-forming polymer.

Processing

Processing and exposure are carried out as in Example 1. Glycol acetate monomethyl ether is used as the developer. Sensitivity: 8 steps of a grey step wedge with a density of 0.15.

Layers prepared from polystyrene with the same crosslinking agent cannot be processed because they show hardly any sensitivity to light.

EXAMPLE 6

Light-sensitive material 20 g. of a copolymer of vinyl toluene and α-methylstyrene (according to U.S. patent specification 3,000,868) are dissolved in 85 ml. of xylene, followed by the addition to the solution thus obtained of 2% by weight of 4,4' - diazido-dibenzalcyclohexanone, based on the film-forming polymer.

Processing

Processing and exposure are carried out as in Example 1. Xylene is used as the developer. Sensitivity: 9 steps of a grey step wedge with a density of 0.15.

Layers prepared from copolymers of styrene and α-methylstyrene with the same crosslinking agent cannot be processed because they are not sensitive to light. No crosslinking occurs and the layer is completely dissolved during development.

EXAMPLE 7

Preparation of the polymer 37.5 g. of a 50% aqueous solution of a basic polyamide of diethylene triamine and adipic acid (molecular weight, 10,000) are diluted with 200 ml. of water, followed by the dropwise addition of 9.0 g. of m-methylbenzoic acid chloride. The mixture was then stirred for 2 hours with 100 ml. of a 4% sodium hydroxide solution, and the aqueous phase decanted off from the polymer precipitated.

Light-sensitive material

A 10% solution in dimethyl formamide was prepared from the polymer thus obtained, followed by the addition of 2% by weight, based on the film-forming polymer, of 4,4'-diazido-di-benzal cyclohexanone.

Processing

Processing and exposure are carried out as in Example 1. A mixture of dimethyl formamide and methanol (3:1) is used as the developer. Sensitivity: 6 steps of a grey step wedge with a density of 0.15.

The unmodified polyamide remains soluble during exposure, even in the presence of the same crosslinking agent. It is impossible to detect any image-wise differentiations.

EXAMPLE 8

20 g. of a sulfochlorinated polyethylene (for example hypalon® 30, a product of Du Pont) were dissolved in 200 ml. of toluene, followed by the dropwise addition at 50° C. of 100 g. of m-toluidine. The mixture is then stirred for 3 hours at 50° C., precipitated in 3 liters of methanol, washed thoroughly with alcohol and dried at 50° C.

Light-sensitive material

A 10% solution in xylene was prepared from the polymer thus obtained, followed by the addition of 2% by weight of 4,4'-diazido-di-benzalcyclohexanone, based on the polymer.

Processing

Processing and exposure are carried out as in Example 1. A highly aromatic solvent, for example benzene or toluene mixtures is used as the developer. Sensitivity: 7 steps of a grey step wedge with a density of 0.15.

The unmodified sulfochlorinated polyethylene remains soluble during exposure in the presence of the same crosslinking agent, the two layers remain soluble.

We claim:

1. A light sensitive polymer having an average molecular weight of between 1,000 and 10,000 consisting essentially of a cross-linkable polyvinyl alcohol or a copolymer of vinyl alcohol containing at least one comonomer selected from the group consisting of ethylene, propylene, butylene, butadiene, isoprene, vinyl chloride, vinylidene chloride, vinyl acetate, vinyl propylether or vinyl isobutylether, said polymer having hydroxyl groups substituted at least partially through a carboxyl ester, acetal or urethane bridge by a benzene ring, methyl- or -ethyl-substituted on the nucleus, said methyl- or -ethyl-substituted benzene rings are in a molar concentration of at least 5% by weight and said polymer containing 0.5 to 25% by weight of a crosslinking diazide of the benzene series.

2. The layer as claimed in claim 1 wherein the polymer is the reaction product of partially hydrolyzed polyvinyl acetate with m-methylbenzoyl chloride.

3. A light sensitive polymer having an average molecular weight of between 1,000 and 100,000 consisting essentially of a cross-linkable polyvinyl alcohol or a copolymer of vinyl alcohol containing at least one comonomer selected from the group consisting of ethylene, propylene, butylene, butadiene, isoprene, vinyl chloride, vinylidene chloride, vinyl acetate, vinyl propylether or vinyl isobutylether, said polymer being substituted at least partially with phenylacetoxy groups and the phenylacetoxy groups are in a molar concentration of at least 5% by weight and said polymer containing 0.5 to 25% by weight of a crosslinking diazide of the benzene series.

References Cited

UNITED STATES PATENTS

| | | | |
|---|---|---|---|
| 2,778,813 | 1/1957 | Gaspar | 260—79.3 R |
| 2,852,379 | 9/1958 | Hepher | 96—91 N |
| 3,096,311 | 7/1963 | Merrill | 260—78.5 |
| 3,278,305 | 10/1966 | Laridon | 96—35.1 |
| 3,467,518 | 9/1969 | Laridon | 96—35.1 |
| 3,532,500 | 10/1970 | Priest | 96—91 N |

JOSEPH L. SCHOFER, Primary Examiner

C. A. HENDERSON, Assistant Examiner

U.S. Cl. X.R.

96—91 N, 115 R; 260—47 EN, 47 CB, 67 R, 75 T, 75 NT, 75 P, 77.5 AP, 77.5 CR, 78 SC, 79.3 R, 80 PS 80.71, 80.75, 80.81, 85.7, 86.7, 87.1, 91.3 VA